US008543346B2

(12) United States Patent
Gross et al.

(10) Patent No.: US 8,543,346 B2
(45) Date of Patent: Sep. 24, 2013

(54) NEAR-ISOTROPIC ANTENNA FOR MONITORING ELECTROMAGNETIC SIGNALS

(75) Inventors: Kenny C. Gross, San Diego, CA (US); Robert P. Masleid, Monte Serreno, CA (US); Ramakrishna C. Dhanekula, San Diego, CA (US); David K. McElfresh, San Diego, CA (US)

(73) Assignee: Oracle America, Inc., Redwood Shores, CA (US)

( * ) Notice: Subject to any disclaimer, the term of this patent is extended or adjusted under 35 U.S.C. 154(b) by 484 days.

(21) Appl. No.: 12/474,486

(22) Filed: May 29, 2009

(65) Prior Publication Data

US 2010/0305892 A1 Dec. 2, 2010

(51) Int. Cl.
*G01R 29/08* (2006.01)

(52) U.S. Cl.
USPC .................. 702/66; 702/38; 702/189; 703/2; 703/13; 343/700 R; 343/703; 455/226.1; 455/269

(58) Field of Classification Search
USPC .................. 702/57, 66, 69, 81, 83, 179, 182, 702/189, 38; 703/2, 13; 343/700 R, 703; 455/226.1, 269
See application file for complete search history.

(56) References Cited

U.S. PATENT DOCUMENTS

| | | | | |
|---|---|---|---|---|
| 6,292,134 | B1 * | 9/2001 | Bondyopadhyay | 342/374 |
| 2004/0196813 | A1 * | 10/2004 | Ofek et al. | 370/334 |
| 2009/0125467 | A1 * | 5/2009 | Dhanekula et al. | 706/20 |

* cited by examiner

*Primary Examiner* — Alexander H Taningco
*Assistant Examiner* — Paul D Lee
(74) *Attorney, Agent, or Firm* — Park, Vaughan, Fleming & Dowler, LLP; Chia-Hsin Suen

(57) ABSTRACT

One embodiment provides a system that analyzes a target electromagnetic signal radiating from a monitored system. During operation, the system monitors the target electromagnetic signal using a near-isotropic antenna that includes a set of receiving surfaces arranged in a regular polyhedron. Next, the system obtains a set of received target electromagnetic signals from the receiving surfaces. Finally, the system assesses the integrity of the monitored system by separately analyzing each of the received target electromagnetic signals.

20 Claims, 9 Drawing Sheets

NEAR-ISOTROPIC ANTENNA FOR MONITORING ELECTROMAGNETIC SIGNALS

BACKGROUND

1. Field

The present embodiments relate to techniques for analyzing electromagnetic signals radiating from electronic systems. More specifically, the present embodiments relate to a method and system for monitoring target electromagnetic signals using a near-isotropic antenna that includes a set of receiving surfaces arranged in a regular polyhedron.

2. Related Art

Electromagnetic signals radiated by computer systems and/or other electronic systems can be used to characterize operating parameters of the electronic systems. However, these electromagnetic signals may be polarized, which can cause the signal received by an antenna to be very sensitive to the orientation of the antenna. In many situations, this orientation-based sensitivity may limit the ability to use the received signal to characterize parameters of the monitored electronic system.

Hence, what is needed is a method and system that characterizes a monitored electronic system by analyzing a target electromagnetic signal radiating from the monitored electronic system without the above-described problems.

SUMMARY

One embodiment provides a system that analyzes a target electromagnetic signal radiating from a monitored system. During operation, the system monitors the target electromagnetic signal using a near-isotropic antenna that includes a set of receiving surfaces arranged in a regular polyhedron. Next, the system obtains a set of received target electromagnetic signals from the receiving surfaces. Finally, the system assesses the integrity of the monitored system by separately analyzing each of the received target electromagnetic signals.

In some embodiments, prior to monitoring the target electromagnetic signal, the system also monitors a reference electromagnetic signal radiating from the computer system using a reference near-isotropic antenna that includes a set of reference receiving surfaces arranged in the regular polyhedron. Next, the system generates a set of reference electromagnetic-signal fingerprints from a set of received reference electromagnetic signals obtained using the reference receiving surfaces. Finally, the system creates a set of reference models from the reference electromagnetic-signal fingerprints to characterize the monitored system.

In some embodiments, the reference models are created using a nonlinear, nonparametric regression technique.

In some embodiments, the nonlinear, nonparametric regression technique corresponds to a multivariate state estimation technique (MSET).

In some embodiments, separately analyzing each of the received target electromagnetic signals involves:

(i) generating a target electromagnetic-signal fingerprint from each of the received target electromagnetic signals;

(ii) feeding the target electromagnetic-signal fingerprint into a reference model from the reference models;

(iii) producing an estimated electromagnetic-signal fingerprint using the reference model; and (iv) comparing the target electromagnetic-signal fingerprint to the estimated electromagnetic-signal fingerprint.

In some embodiments, comparing the target electromagnetic-signal fingerprint to the estimated electromagnetic-signal fingerprint involves computing a residual signal from the target electromagnetic-signal fingerprint and the estimated electromagnetic-signal fingerprint and applying a sequential-analysis technique to detect a statistical deviation of the residual signal.

In some embodiments, the sequential-analysis technique corresponds to a sequential probability ratio test (SPRT).

In some embodiments, the statistical deviation is used to identify a fault in the monitored system if the assessed integrity falls below a threshold.

In some embodiments, the fault corresponds to at least one of a modified chip, a counterfeit component, and one or more metal whiskers.

In some embodiments, the receiving surfaces are arranged in an icosahedron.

BRIEF DESCRIPTION OF THE FIGURES

In the figures, like reference numerals refer to the same figure elements.

DETAILED DESCRIPTION

Figure 1:
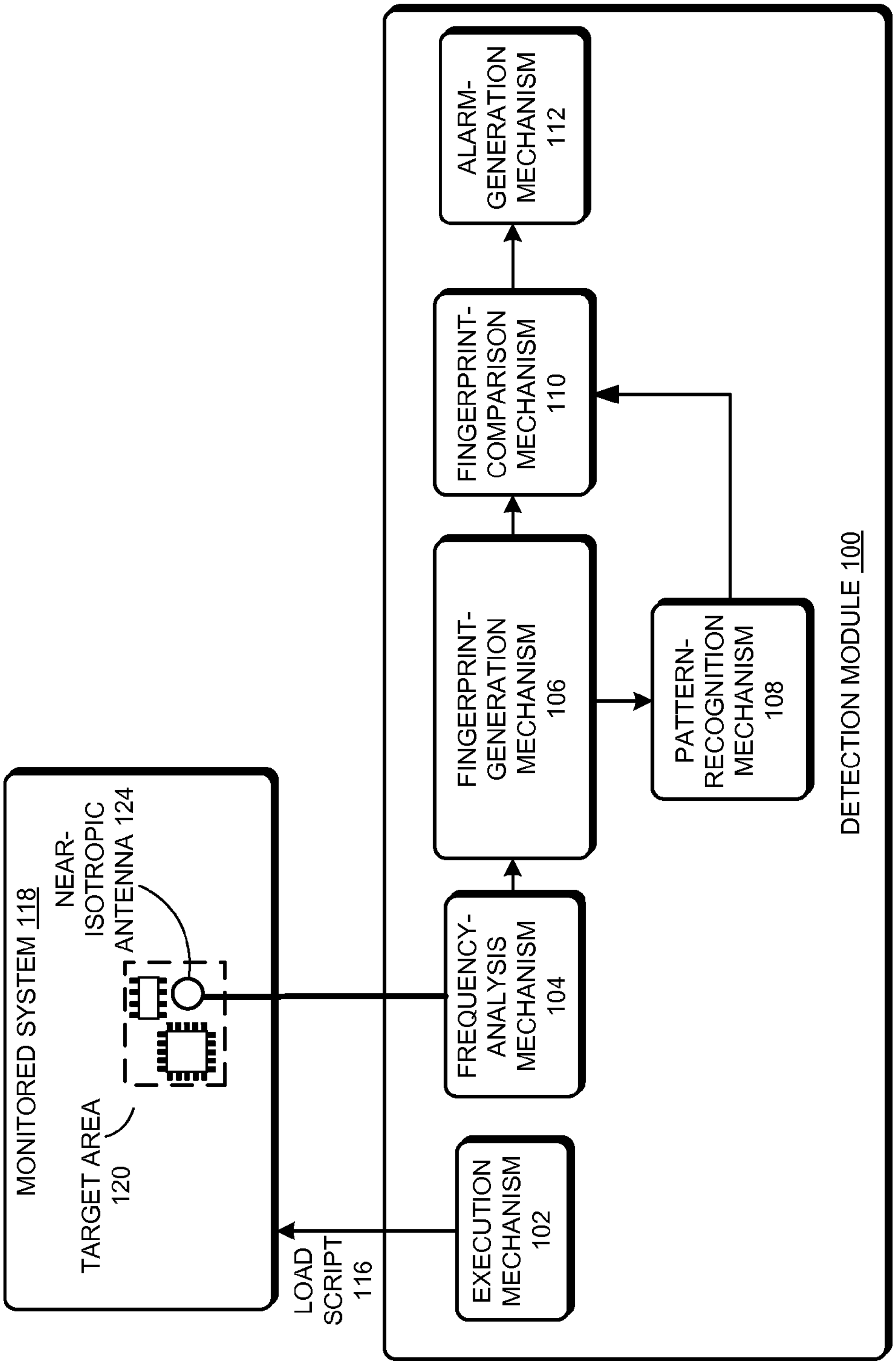
FIG. 1 illustrates a system that analyzes a target electromagnetic signal radiating from a monitored system in accordance with an embodiment.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing instructions and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Embodiments provide a method and system for monitoring a target electromagnetic signal radiating from a monitored system. The monitored system may correspond to an electronic system such as a computer system, a medical electronic system, a consumer electronic system (e.g., television, stereo, game consol, etc.), and/or an aerospace electronic system. An antenna may be used to monitor the target electromagnetic signal from one or more components of the monitored system. The target electromagnetic signal may then be analyzed to assess the integrity of the monitored system.

More specifically, embodiments provide a method and system for monitoring the target electromagnetic signal using a near-isotropic antenna. The near-isotropic antenna may include a set of receiving surfaces arranged in a regular polyhedron, such as an icosahedron. Each of the receiving surfaces may monitor a received target electromagnetic signal associated with the target electromagnetic signal. In particular, each received target electromagnetic signal may be monitored as the target electromagnetic signal arriving from a direction in which the corresponding receiving surface faces within the monitored system. Each received target electromagnetic signal may also be separately analyzed to assess the integrity of the monitored system.

Embodiments may thus eliminate directional dependence in analyzing electromagnetic signals from the monitored system. Embodiments may further facilitate a more thorough characterization of the monitored system through the separate analysis of multiple signals received from a number of directions by a near-isotropic antenna instead of the analysis of a single signal received from a directionally limited antenna.

FIG. 1 shows a system that analyzes a target electromagnetic signal radiating from a monitored system 118 in accordance with an embodiment. The system may be used to characterize a monitored system 118, such as a computer system, a consumer electronics device, an aerospace electronic system, a medical electronic system, and/or another system that includes electronic components. In particular, the system of FIG. 1 may be used to characterize monitored system 118 by monitoring and analyzing a target electromagnetic signal radiating from monitored system 118.

As shown in FIG. 1, the system includes a detection module 100 and a near-isotropic antenna 124. Detection module 100 includes an execution mechanism 102, a frequency-analysis mechanism 104, a fingerprint-generation mechanism 106, a pattern-recognition mechanism 108, a fingerprint-comparison mechanism 110, and an alarm-generation mechanism 112. Monitored system 118 includes target area 120.

Execution mechanism 102 causes load script 116 to run on monitored system 118. Frequency-analysis mechanism 104 is coupled to near-isotropic antenna 124 and fingerprint-generation mechanism 106. Fingerprint-generation mechanism 106 is coupled to pattern-recognition mechanism 108 and fingerprint-comparison mechanism 110. Pattern-recognition mechanism 108 is coupled to fingerprint-comparison mechanism 110, and fingerprint-comparison mechanism 110 is coupled to alarm-generation mechanism 112.

Frequency-analysis mechanism 104, fingerprint-generation mechanism 106, pattern-recognition mechanism 108, fingerprint-comparison mechanism 110, and alarm-generation mechanism 112 may each be implemented in any combination of hardware and software. In one or more embodiments, one or more of these mechanisms operates on monitored system 118. For example, one or more of these mechanisms may operate on one or more service processors, central processing units (CPUs), microprocessors, microcontrollers, and/or programmable logic controllers (PLCs) on monitored system 118. As a result, one or more of these mechanisms may be located inside monitored system 118. Alternatively, one or more of these mechanisms may operate on a separate system, such as a computer system operatively connected to monitored system 118 through an interface and/or network connection.

Target area 120 may correspond to any area of monitored system 118 that radiates electromagnetic signals. In one or more embodiments, target area 120 includes one or more semiconductor circuits, devices, electromechanical devices, printed circuit boards, and/or other electronic components that emit electromagnetic signals. For example, target area 120 may include all of monitored system 118. Target area 120 may also correspond to multiple target areas in one or more monitored systems.

Near-isotropic antenna 124 is coupled to frequency-analysis mechanism 104 and is positioned to receive electromagnetic signals from target area 120. Near-isotropic antenna 124 may include a set of receiving surfaces arranged in a regular polyhedron. For example, near-isotropic antenna 124 may correspond to an icosahedron that contains 20 triangular receiving surfaces. As a result, near-isotropic antenna 124 may include functionality to monitor electromagnetic signals arriving from a number of directions in target area 120. In other words, near-isotropic antenna 124 may reduce or eliminate directional dependence associated with monitoring electromagnetic signals of a particular polarization and/or strength. Near-isotropic antenna 124 is discussed in further detail below with respect to FIG. 2.

In one or more embodiments, near-isotropic antenna 124 is placed at a fixed position inside monitored system 118. For example, near-isotropic antenna 124 may be placed in a predetermined position in monitored system 118 during manufacturing or assembly of monitored system 118. Furthermore, near-isotropic antenna 124 may be placed in a predetermined relationship with respect to one or more components or areas inside monitored system 118. For example, to receive electromagnetic signals from a processor in monitored system 118, near-isotropic antenna 124 may be placed near the processor. In one or more embodiments, near-isotropic antenna 124 is inserted into monitored system 118 through an opening in the chassis. Near-isotropic antenna 124 may also be moved to a predetermined number of pre-specified locations within monitored system 118 to detect electromagnetic signals at each location.

On the other hand, near-isotropic antenna 124 may be placed outside monitored system 118. Furthermore, near-isotropic antenna 124 may be positioned in close proximity to monitored system 118 or at a distance from monitored system 118. In one or more embodiments, better sensitivity and, hence, higher signal-to-noise ratio (SNR) may be achieved by placing near-isotropic antenna 124 closer to monitored system 118 and/or near specific components or areas of monitored system 118.

In one or more embodiments, near-isotropic antenna 124 is held in a fixed orientation with respect to monitored system 118 or the component in monitored system 118 from which the electromagnetic radiation is to be detected. To hold near-isotropic antenna 124 in the fixed orientation, near-isotropic antenna 124 may be physically attached to a portion of monitored system 118 or a component inside monitored system 118. For example, near-isotropic antenna 124 may be physically attached to a printed circuit board in monitored system 118. Furthermore, near-isotropic antenna 124 may be integrated into a component in monitored system 118.

The electromagnetic signals detected by near-isotropic antenna 124 may be used by an analysis apparatus (e.g., detection module 100) to characterize monitored system 118. In particular, the analysis apparatus may analyze a target electromagnetic signal monitored by near-isotropic antenna 124 to assess the integrity of monitored system 118. To assess the integrity of monitored system 118, the analysis apparatus may characterize parameters such as a model or manufacturer, the authenticity of a component, modifications made to a component, the presence and length of metal whiskers, a physical variable, a fault, a prognostic variable, a health metric, and/or other parameters that affect electromagnetic signals radiated from monitored system 118.

Furthermore, the analysis techniques that may be used by the analysis apparatus to analyze the target electromagnetic signal obtained from near-isotropic antenna 124 is discussed in the following: U.S. patent application entitled "Using EMI Signals to Facilitate Proactive Fault Monitoring in Computer Systems," by Kenny C. Gross, Aleksey M. Urmanov, Ramakrishna C. Dhanekula and Steven F. Zwinger, application Ser. No. 11/787,003, filed 12 Apr. 2007, which is hereby fully incorporated by reference; U.S. patent application entitled "Method and Apparatus for Generating an EMI Fingerprint for a Computer System," by Kenny C. Gross, Aleksey M. Urmanov, and Ramakrishna C. Dhanekula, application Ser. No. 11/787,027, filed 12 Apr. 2007, which is hereby fully incorporated by reference; U.S. patent application entitled "Accurately Inferring Physical Variable Values Associated with Operation of a Computer System," by Ramakrishna C. Dhanekula, Kenny C. Gross, and Aleksey M. Urmanov, application Ser. No. 12/001,369, filed 10 Dec. 2007, which is hereby fully incorporated by reference; U.S. patent application entitled "Proactive Detection of Metal Whiskers in Computer Systems," by Ramakrishna C. Dhanekula, Kenny C. Gross, and David K. McElfresh, application Ser. No. 11/985,288, filed 13 Nov. 2007, which is hereby fully incorporated by reference; U.S. patent application entitled "Detecting Counterfeit Electronic Components Using EMI Telemetric Fingerprints," by Kenny C. Gross, Ramakrishna C. Dhanekula, and Andrew J. Lewis, application Ser. No. 11/974,788, filed 16 Oct. 2007, which is hereby fully incorporated by reference; and U.S. patent application entitled "Determining a Total Length for Conductive Whiskers in Computer Systems," by David K. McElfresh, Kenny C. Gross, and Ramakrishna C. Dhanekula, application Ser. No. 12/126,612, filed 23 May 2008, which is hereby fully incorporated by reference.

In one or more embodiments, execution mechanism 102 causes load script 116 to be executed by monitored system 118 during a parameter-detection process. In particular, execution mechanism 102 may execute the load script on one or more processors (e.g., microprocessors, microcontrollers, central processing units (CPUs), graphics-processing units (GPUs), programmable logic controllers (PLCs), etc.) in monitored system 118. In addition, the parameter-detection process may be performed in parallel with normal operation of monitored system 118. Execution mechanism 102 may be used only during the training phase of the parameter-detection process. As a result, execution mechanism 102 may be idle during the monitoring phase of the parameter-detection process. On the other hand, execution mechanism 102 may cause load script 116 to be executed by monitored system 118 during the training phase. Then, during the parameter-detection process, normal operation of monitored system 118 may be interrupted as execution mechanism 102 causes load script 116 to be executed by monitored system 118. In one or more embodiments, load script 116 is stored on monitored system 118.

In one or more embodiments, load script 116 is executed as a sequence of instructions that produces a load profile that oscillates between specified processor utilization percentages. Alternatively, execution mechanism 102 may execute the load script as a sequence of instructions that produces a customized load profile. In other words, the load script may correspond to a dynamic load script that changes the load on the processor(s) as a function of time.

In one or more embodiments, during the parameter-detection process, the target electromagnetic signal generated within one or more circuits in target area 120 is collected by near-isotropic antenna 124. In particular, the target electromagnetic signal may be monitored by each receiving surface of near-isotropic antenna 124 as a received target electromagnetic signal. Consequently, near-isotropic antenna 124 may provide a set of received target electromagnetic signals obtained from a variety of directions within monitored system 118 for analysis.

The received target electromagnetic signal from each receiving surface may be obtained by frequency-analysis mechanism 104 as a received electromagnetic-signal time-series. Frequency-analysis mechanism 104 may also transform each of the received electromagnetic-signal time-series to the frequency-domain. In one or more embodiments, one or more of the received target electromagnetic signals are amplified prior to being transformed into the frequency domain. In one or more embodiments, frequency-analysis mechanism 104 includes a spectrum analyzer. Frequency-analysis mechanism 104 can also include a low-cost demodulator and a low-cost sampler.

Frequency-analysis mechanism 104 is coupled to fingerprint-generation mechanism 106. In one or more embodiments, fingerprint-generation mechanism 106 includes functionality to generate a separate target electromagnetic-signal fingerprint based on the frequency-domain representation of each received target electromagnetic signal obtained from a receiving surface of near-isotropic antenna 124. Generation of electromagnetic-signal fingerprints is described in further detail below with respect to FIG. 3.

As shown in FIG. 1, the output of fingerprint-generation mechanism 106 is coupled to the inputs of both pattern-recognition mechanism 108 and fingerprint-comparison mechanism 110. In one or more embodiments, pattern-recognition mechanism 108 builds a separate reference model for each receiving surface of near-isotropic antenna 124. The reference model may estimate the electromagnetic-signal fingerprint associated with the received target electromagnetic signal obtained by the receiving surface. Pattern-recognition mechanism 108 may then use the reference models to compute estimates of the electromagnetic-signal fingerprints associated with a target electromagnetic signal monitored by near-isotropic antenna 124 in target area 120. The operation of pattern-recognition mechanism 108 is described below with respect to FIGS. 5-6.

For each received target electromagnetic signal obtained from a receiving surface of near-isotropic antenna 124, fingerprint-comparison mechanism 110 compares the target electromagnetic-signal fingerprint generated by fingerprint-generation mechanism 106 to an estimated electromagnetic-signal fingerprint computed by the corresponding reference model. The comparison performed by fingerprint-comparison mechanism 110 is described below with respect to FIG. 6. Alarm-generation mechanism 112 may then generate an alarm based on the comparison performed by fingerprint-comparison mechanism 110. In one or more embodiments, information related to the generated alarms is used to characterize monitored system 118 and/or assess the integrity of monitored system 118.

Figure 2:
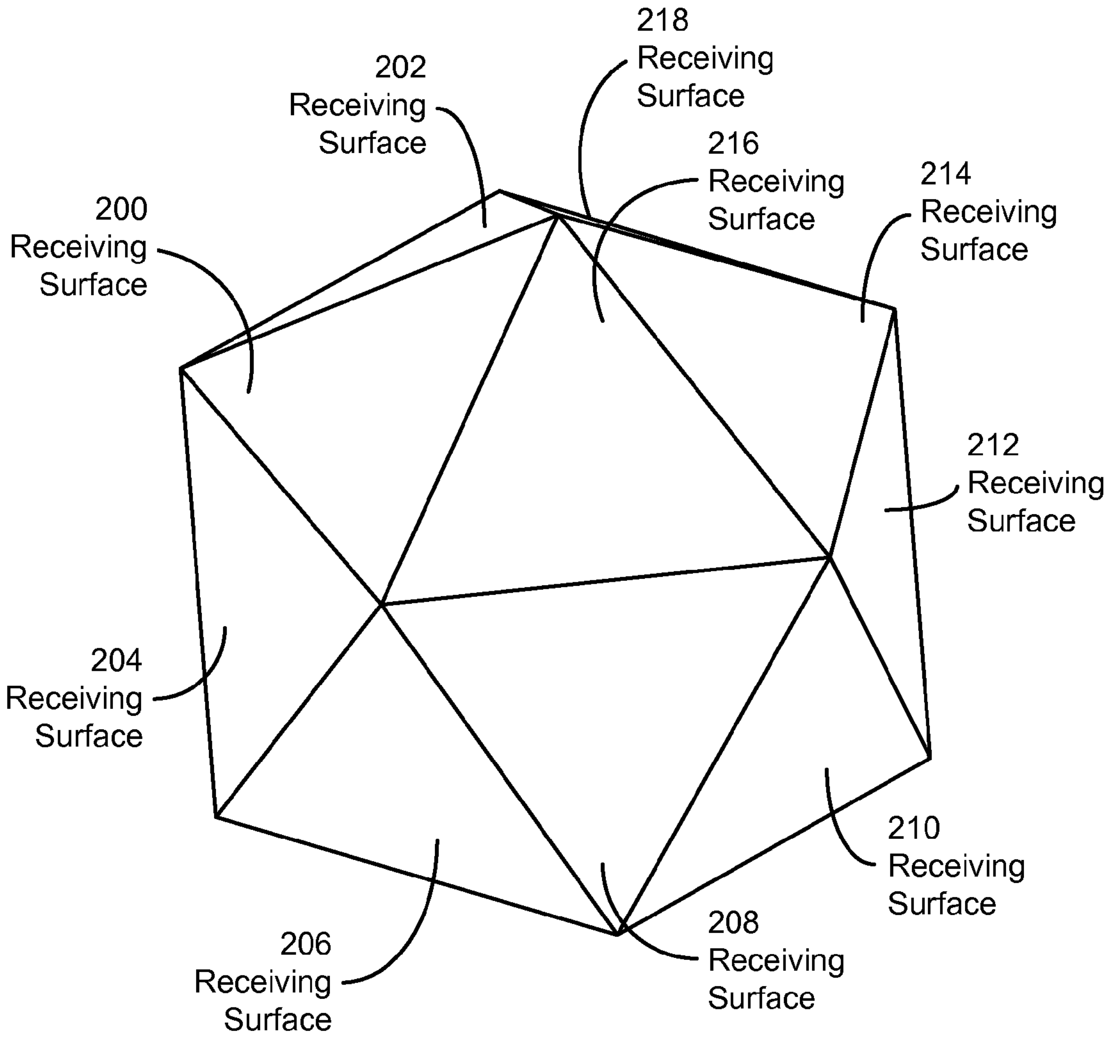
FIG. 2 shows a near-isotropic antenna in accordance with an embodiment.

FIG. 2 shows a near-isotropic antenna in accordance with an embodiment. As described above, the near-isotropic antenna may greatly reduce or eliminate directional dependence in monitoring target electromagnetic signals from a monitored system. As shown in FIG. 2, a number of visible receiving surfaces 200-218 and an additional number of non-visible receiving surfaces arranged in an icosahedron may enable the near-isotropic antenna to approximate the behavior of a three-dimensional isotropic antenna. The near-isotropic antenna may also be modeled after other regular polyhedrons, such as dodecahedrons and/or octahedrons.

Each of the 20 receiving surfaces in the near-isotropic antenna may allow a target electromagnetic signal to be detected from a different direction. Furthermore, the arrangement of the receiving surfaces in an icosahedron may allow the target electromagnetic signal to be detected from 20 substantially uniformly-spaced directions in three-dimensional space around the near-isotropic antenna, thereby approximating isotropic antenna functionality. As a result, the near-isotropic antenna may not be subject to orientation-based sensitivity that is common to other antennas, such as loop antennas, fractal antennas, dipole antennas, parabolic antennas, and/or electrical short antennas.

As mentioned previously, each receiving surface may monitor a received target electromagnetic signal corresponding to the target electromagnetic signal received from the direction or directions toward which the receiving surface faces. The received target electromagnetic signal may be sent to a demodulator (e.g., a radio frequency (RF) demodulator) via a wire connecting the receiving surface and the demodulator. The demodulator may then convert the received target electromagnetic signal into a digitized electromagnetic-signal time-series for analysis of the monitored system using the electromagnetic-signal time-series.

Those skilled in the art will appreciate that the near-isotropic antenna may be built to a variety of sizes based on the use of the antenna. For example, integrity assessment of the monitored system may be facilitated by constructing the icosahedron of the near-isotropic antenna using smaller dimensions (e.g., circumscribed by a one-inch diameter sphere) so that the near-isotropic antenna may be placed within or near the monitored system. Alternatively, the dimensions of the near-isotropic antenna may be based on the wavelength of the target electromagnetic signal if the near-isotropic antenna is used to reproduce the target electromagnetic signal at a high granularity (e.g., high fidelity music, large images, etc.) from the monitored system.

Figure 3:
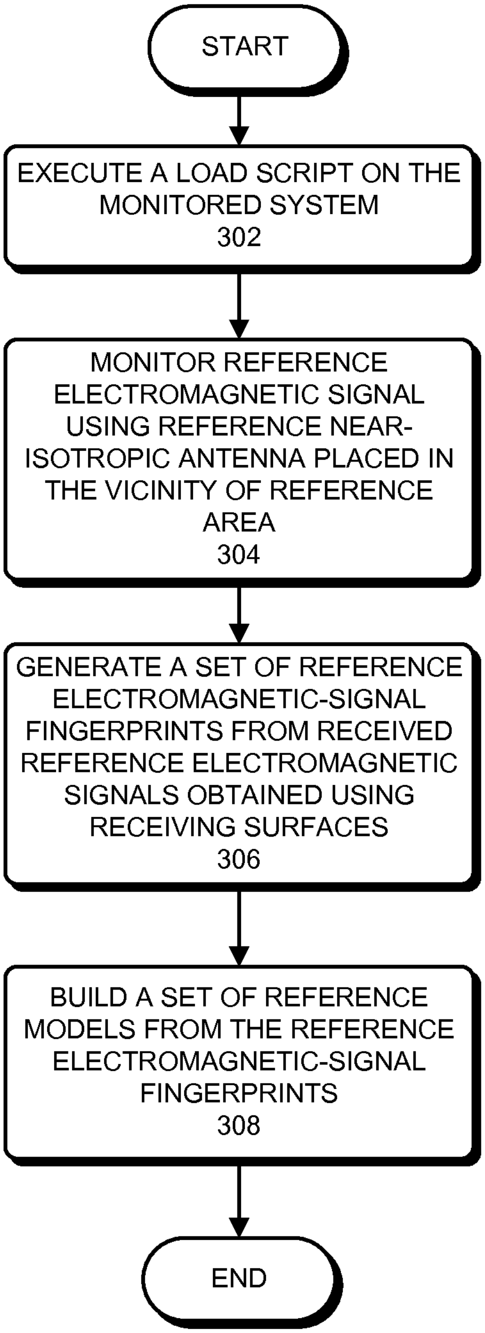
FIG. 3 shows a flowchart illustrating the process of building a set of reference models in accordance with an embodiment.

FIG. 3 shows a flowchart illustrating the process of building a set of reference models in accordance with an embodiment. In one or more embodiments, one or more of the steps may be omitted, repeated, and/or performed in a different order. Accordingly, the specific arrangement of steps shown in FIG. 3 should not be construed as limiting the scope of the technique.

First, a load script is executed on the monitored system (operation 302). The load script may correspond to a dynamic load script that changes the load on one or more processors in the monitored system as a function of time. As the load script is executed, a reference electromagnetic signal is monitored using a reference near-isotropic antenna placed in the vicinity of a reference area within the monitored system (operation 304). The reference electromagnetic signal may be obtained from the monitored system when the monitored system is in a known state. For example, the reference electromagnetic signal may be collected when the monitored system is first manufactured and/or deployed. In other words, the reference electromagnetic signal may be obtained from a "known good" monitored system that does not exhibit degradation or include counterfeit components. Furthermore, the reference area may correspond to a target area (e.g., target area 120 of FIG. 1) of the monitored system in the known state.

The reference near-isotropic antenna (e.g., near-isotropic antenna 124 of FIG. 1) may include a set of receiving surfaces arranged in a regular polyhedron. Each receiving surface may obtain the reference electromagnetic signal as a received reference electromagnetic signal from the direction toward which the receiving surface faces. The received reference electromagnetic signals may then be used to generate a set of reference electromagnetic-signal fingerprints (operation 306), as described below with respect to FIG. 4. Finally, a set of reference models may be built from the reference electromagnetic-signal fingerprints (operation 308) to characterize the monitored system.

In one or more embodiments, the reference models are built using a nonlinear, nonparametric (NLNP) regression technique. In one or more embodiments, the NLNP regression technique corresponds to a multivariate state estimation technique (MSET). The term "MSET" as used in this specification refers to a class of pattern-recognition techniques. For example, see [Gribok] "Use of Kernel Based Techniques for Sensor Validation in Nuclear Power Plants," by Andrei V. Gribok, J. Wesley Hines, and Robert E. Uhrig, *The Third American Nuclear Society International Topical Meeting on Nuclear Plant Instrumentation and Control and Human-Machine Interface Technologies*, Washington D.C., Nov. 13-17, 2000. This paper outlines several different pattern recognition approaches. Hence, the term "MSET" as used in this specification may refer to (among other things) any technique outlined in [Gribok], including ordinary least squares (OLS), support vector machines (SVM), artificial neural networks (ANNs), MSET, or regularized MSET (RMSET).

Figure 4:
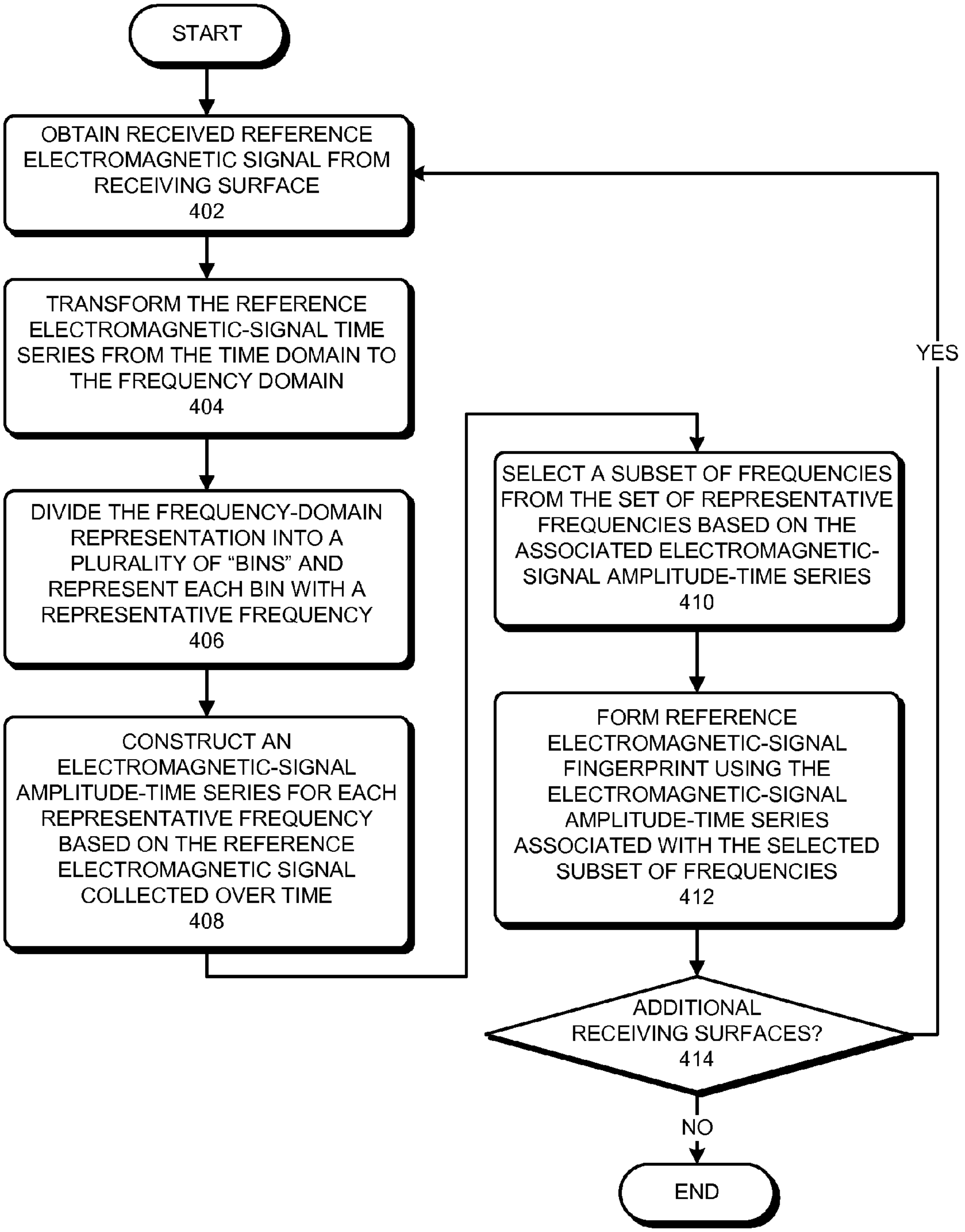
FIG. 4 shows a flowchart illustrating the process of generating a set of reference electromagnetic-signal fingerprints in accordance with an embodiment.

FIG. 4 shows a flowchart illustrating the process of generating a set of reference electromagnetic-signal fingerprints in accordance with an embodiment. In one or more embodiments, one or more of the steps may be omitted, repeated, and/or performed in a different order. Accordingly, the specific arrangement of steps shown in FIG. 4 should not be construed as limiting the scope of the technique.

First, a received reference electromagnetic signal is obtained from a receiving surface of a near-isotropic antenna (operation 402). As described above, the received reference electromagnetic signal may be obtained as a reference electromagnetic-signal time series provided by a demodulator to which the receiving surface is connected (e.g., by a wire). Next, the reference electromagnetic-signal time series is transformed from the time domain to the frequency domain (operation 404). For example, a fast Fourier transform (FFT) may be used to transform the electromagnetic-signal time-series from the time domain to the frequency domain. Those skilled in the art will appreciate that other transform functions may also be used, including, but not limited to, a Laplace transform, a discrete Fourier transform, a Z-transform, and any other transform technique now known or later developed.

The frequency-domain representation of the reference electromagnetic-signal time series is then divided into a plurality of "bins," and each "bin" is represented with a representative frequency (operation 406). For example, the frequency range of the reference electromagnetic-signal time series may be divided into a number of bins. The frequency bins and associated representative frequencies may also be equally spaced.

An electromagnetic-signal amplitude-time series is then constructed for each representative frequency based on the reference electromagnetic-signal time series collected over a predetermined period (operation 408). To generate the time series for each representative frequency, the received reference electromagnetic signal may be sampled at predetermined time intervals (e.g., every second, every minute, etc.). Each pair of electromagnetic signal samples may then be transformed into the frequency domain, and an electromagnetic-signal amplitude-time pair may be subsequently extracted for each representative frequency at each time interval. In this way, a large number of separate electromagnetic-signal amplitude-time series may be generated for the representative frequencies.

Next, a subset of frequencies from the representative frequencies is selected based on the associated electromagnetic-signal amplitude-time series (operation 410), as discussed below with respect to FIG. 5. For example, 30 target frequencies from an original set of for example 600 representative frequencies may be selected to minimize computation costs while retaining detection sensitivity. On the other hand, all of the representative frequencies may be used. A reference electromagnetic-signal fingerprint is then formed using the electromagnetic-signal amplitude-time series associated with the selected subset of frequencies (operation 412).

In one or more embodiments, the electromagnetic-signal amplitude-time series used to generate the reference electromagnetic-signal fingerprint is used as training data for the reference model associated with the electromagnetic-signal fingerprint. As described above, the reference model may be created using an NLNP regression technique such as MSET. To train the reference model, the electromagnetic-signal amplitude-time series (i.e., the reference electromagnetic-signal fingerprint) is provided as input (i.e., training data) to the reference model. The reference model may then use the input to learn the patterns of interaction between the different electromagnetic-signal amplitude-time series. Once the reference model is trained, the reference model may generate accurate estimates of the same electromagnetic-signal amplitude-time series. As discussed below, the estimates may be used to calculate a residual signal that is used to characterize a monitored system (e.g., monitored system 118 of FIG. 1).

If additional receiving surfaces (operation 414) are used to monitor the reference electromagnetic signal, operations 402-412 are repeated for the other receiving surfaces of the near-isotropic antenna. For example, operations 402-412 may be performed for each of 20 receiving surfaces in a near-isotropic icosahedral antenna. Furthermore, the generation of reference electromagnetic-signal fingerprints from the received reference electromagnetic signals may occur in parallel or sequentially.

Figure 5:
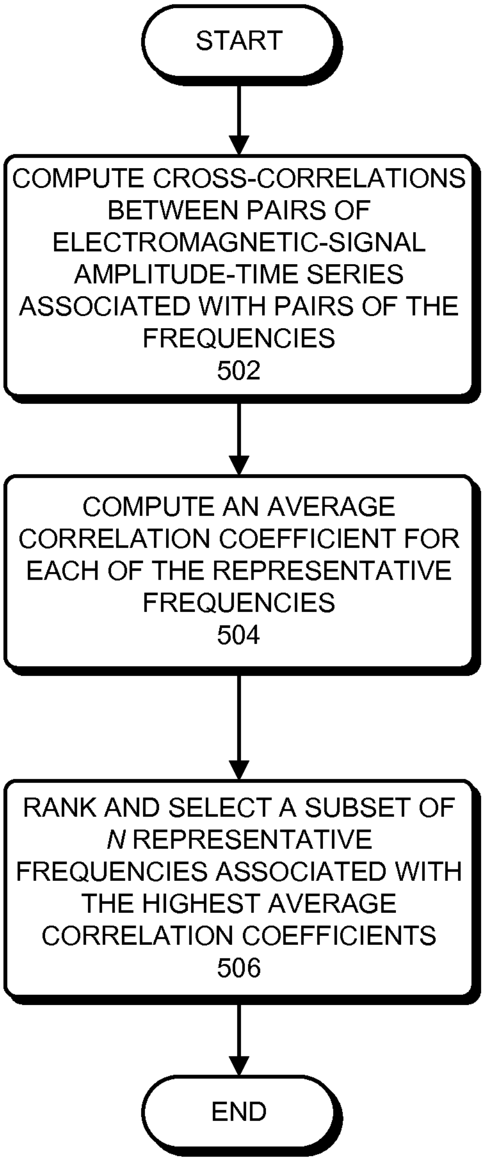
FIG. 5 shows a flowchart illustrating the process of selecting a subset of frequencies based on the correlations between a set of electromagnetic-signal amplitude-time series in accordance with an embodiment.

FIG. 5 shows a flowchart illustrating the process of selecting a subset of frequencies based on the correlations between a set of electromagnetic-signal amplitude-time series in accordance with an embodiment. In one or more embodiments, one or more of the steps may be omitted, repeated, and/or performed in a different order. Accordingly, the specific arrangement of steps shown in FIG. 5 should not be construed as limiting the scope of the technique.

Initially, cross-correlations are computed between pairs of electromagnetic-signal amplitude-time series associated with pairs of the representative frequencies (operation 502). Next, an average correlation coefficient is computed for each of the representative frequencies (operation 504). A subset of N representative frequencies associated with the highest average correlation coefficients is then ranked and selected (operation 506). In other words, the electromagnetic-signal amplitude-time series associated with the N frequencies (e.g., 20 frequencies) may be most highly correlated with other amplitude-time series.

Figure 6:
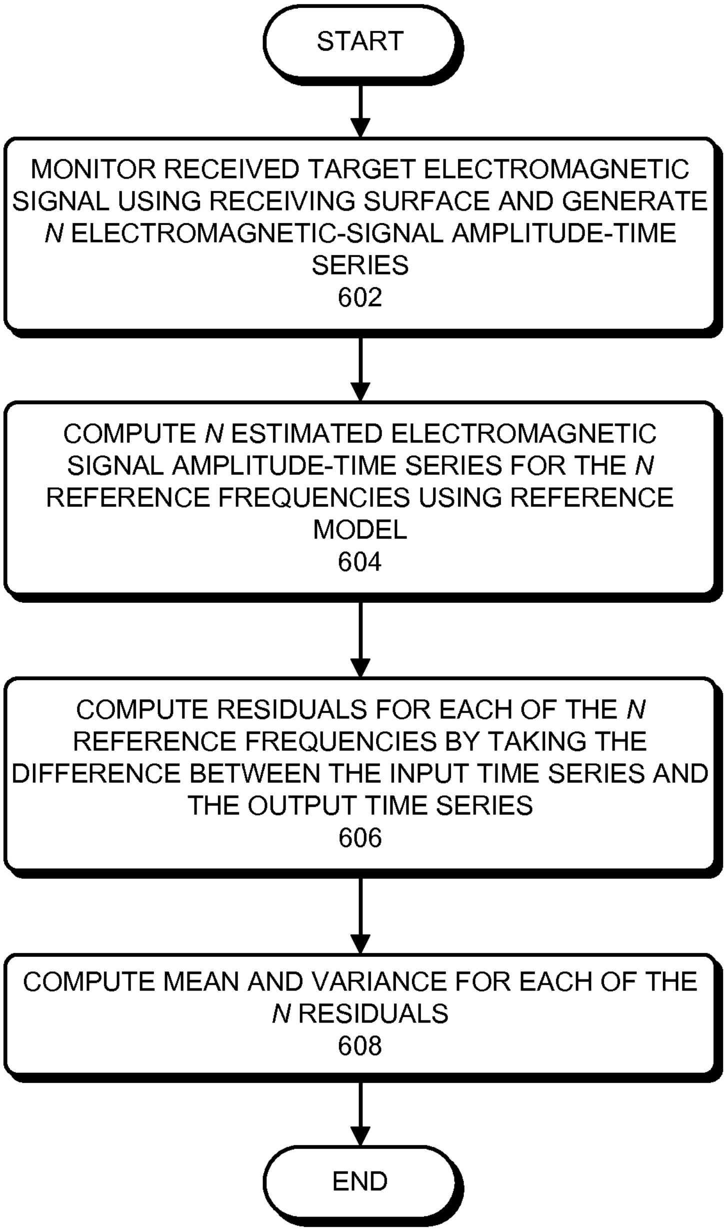
FIG. 6 shows a flowchart illustrating the process of computing a residual signal in accordance with an embodiment.

FIG. 6 shows a flowchart illustrating the process of computing a residual signal in accordance with an embodiment. In one or more embodiments, one or more of the steps may be omitted, repeated, and/or performed in a different order. Accordingly, the specific arrangement of steps shown in FIG. 6 should not be construed as limiting the scope of the technique.

First, a received target electromagnetic signal is monitored using a receiving surface of a near-isotropic antenna, and a set of N electromagnetic-signal amplitude-time series is generated from the received target electromagnetic signal (operation 602). The electromagnetic-signal amplitude-time series may be generated from the received target electromagnetic signal in the same way that an electromagnetic-signal amplitude-time series is generated from a received reference electromagnetic signal. In other words, the received target electromagnetic signal may be sampled at predetermined time intervals (e.g., every second, every minute, etc.). Each pair of electromagnetic signal samples may then be transformed into the frequency domain and an electromagnetic-signal amplitude-time pair subsequently extracted for each representative frequency at each time interval. The N electromagnetic-signal amplitude-time series may then be constructed from the amplitude-time pairs of the N representative frequencies used to build a reference electromagnetic-signal fingerprint associated with the receiving surface.

Next, N estimated electromagnetic-signal amplitude-time series for the N reference frequencies are computed using the reference model (operation 604) for the receiving surface. In particular, the reference model may receive the set of N electromagnetic-signal amplitude-time series as inputs and produce a corresponding set of N estimated electromagnetic-signal amplitude-time series as outputs. Residuals for each of the N reference frequencies are then computed by taking the difference between the input time series and the corresponding output time series (operation 606). As a result, N residuals may be obtained in operation 606. The mean and variance for each of the N residuals is then computed (step 608).

The process shown in FIG. 6 may be repeated for a number of received target electromagnetic signals. For example, N residuals may be calculated for each of 20 received target electromagnetic signals obtained from 20 receiving surfaces of a near-isotropic icosahedral antenna. Similarly, N residuals may be calculated for each of 12 received target electromagnetic signals obtained from 12 receiving surfaces of a near-isotropic dodecahedral antenna.

Figure 7:
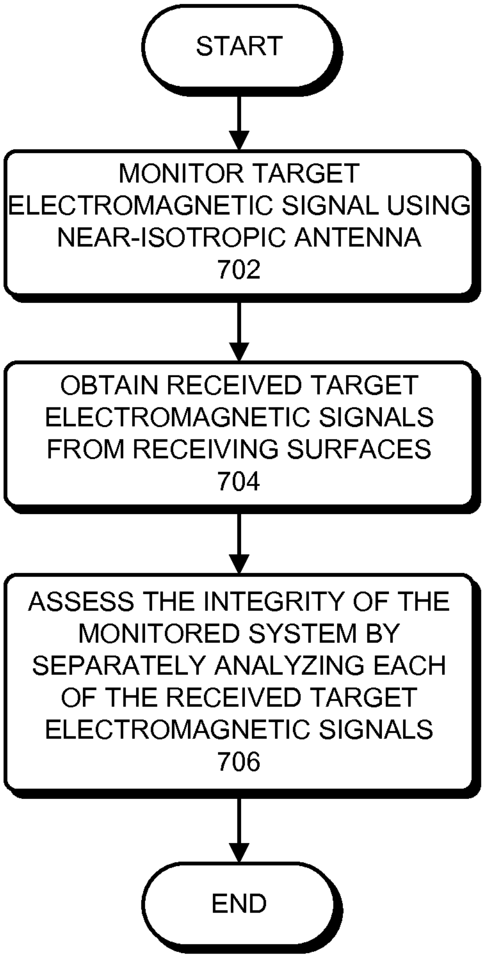
FIG. 7 shows a flowchart illustrating the process of analyzing a target electromagnetic signal radiating from a monitored system in accordance with an embodiment.

FIG. 7 shows a flowchart illustrating the process of analyzing a target electromagnetic signal radiating from a monitored system in accordance with an embodiment. In one or more embodiments, one or more of the steps may be omitted, repeated, and/or performed in a different order. Accordingly, the specific arrangement of steps shown in FIG. 7 should not be construed as limiting the scope of the technique.

First, the target electromagnetic signal is monitored using a near-isotropic antenna (operation 702). The near-isotropic antenna may include a set of receiving surfaces arranged in a regular polyhedron, such as an icosahedron. Each receiving surface may be used to monitor the target electromagnetic signal received from a particular direction by the near-isotropic antenna. In other words, the target electromagnetic signal may be obtained as a set of received target electromagnetic signals from the receiving surfaces (operation 704). For example, an icosahedral antenna may provide 20 received target electromagnetic signals corresponding to 20 triangular receiving surfaces on the icosahedral antenna.

Next, the integrity of the monitored system is assessed by separately analyzing each of the received target electromagnetic signals (operation 706), as discussed below with respect to FIG. 8. Because received target electromagnetic signals are monitored from essentially all directions by the near-isotropic antenna, orientation-based sensitivity to the target electromagnetic signal may be significantly reduced or eliminated. The individual analysis of multiple received target electromagnetic signals may further enable a more comprehensive characterization of the monitored system. For example, analysis of multiple received target electromagnetic signals may allow for detection of counterfeit components, metal whiskers, and/or modified chips in the monitored system. (See U.S. patent application Ser. No. 12/126,612, entitled "Determining a Total Length for Conductive Whiskers in Computer Systems," by inventors David K. McElfresh, Kenny C. Gross and Ramakrishna C. Dhanekula, which is hereby incorporated by reference).

Counterfeit components are components that use packaging, labeling and part numbers that closely match authentic parts, so that the counterfeit parts cannot be easily distinguished from authentic parts through a visual inspection. However, in order for the above-described techniques to work, the internal circuitry of the counterfeit part needs to be different from the authentic part, which leads to a slightly different electronic signature from the authentic part. Note that although a counterfeiter may be able to easily match the packaging and labeling of an authentic component, it is very hard, if not impossible, for the counterfeiter to manufacture components that produce the same electronic signature as an authentic component.

Consequently, the integrity of the monitored system may be verified with high confidence if no anomalies are detected in the target electromagnetic signals. On the other hand, if anomalies are found in one or more target electromagnetic signals, the monitored system may be disassembled and/or inspected more closely to determine the source of the anomalies. In other words, the near-isotropic antenna may enable integrity analysis of the monitored system during normal operation of the monitored system, thus facilitating availability and rapid detection of degradation and faults in the monitored system.

Figure 8:
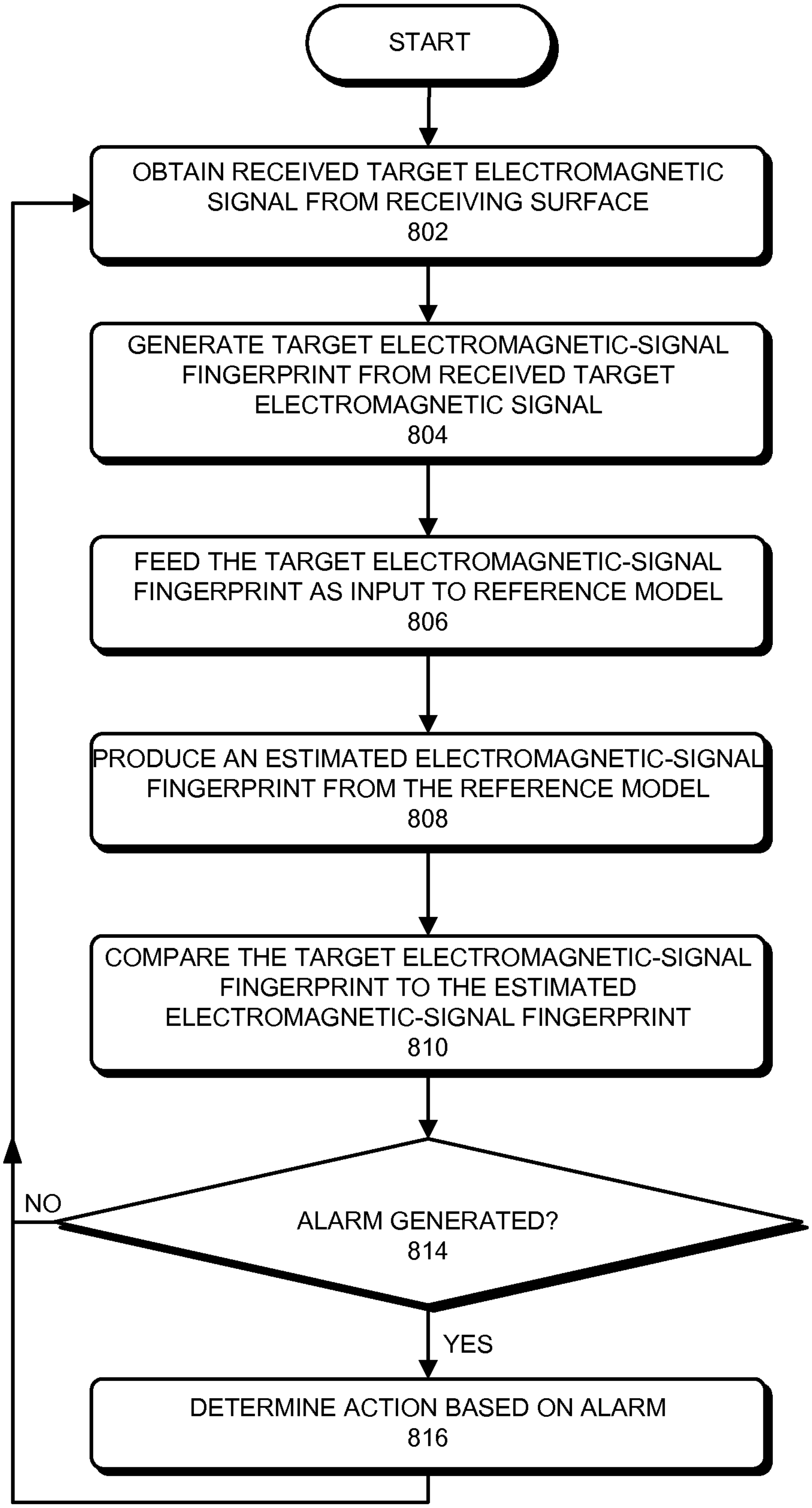
FIG. 8 shows a flowchart illustrating the process of analyzing a received target electromagnetic signal in accordance with an embodiment.

FIG. 8 shows a flowchart illustrating the process of analyzing a received target electromagnetic signal in accordance with an embodiment. In one or more embodiments, one or more of the steps may be omitted, repeated, and/or performed in a different order. Accordingly, the specific arrangement of steps shown in FIG. 8 should not be construed as limiting the scope of the technique.

First, a received target electromagnetic signal is obtained from a receiving surface of a near-isotropic antenna (operation 802). Next, a target electromagnetic-signal fingerprint is generated from the received target electromagnetic signal (operation 804). The target electromagnetic-signal fingerprint may be generated from the electromagnetic signal in a similar manner to the generation of the reference electromagnetic-signal fingerprint as described with respect to FIG. 4.

In particular, the target electromagnetic-signal fingerprint may be generated by: (1) transforming the electromagnetic-signal time series corresponding to the received target electromagnetic signal from the time domain to the frequency domain; (2) for each of the set of N frequencies in the reference electromagnetic-signal fingerprint for the receiving surface, generating a monitored electromagnetic-signal amplitude-time series based on the frequency-domain representation of the received target electromagnetic signal collected over time; and (3) forming the target electromagnetic-signal fingerprint using the set of N monitored electromagnetic-signal amplitude-time series associated with the selected N frequencies. In one or more embodiments, the target electromagnetic-signal fingerprint includes all N frequencies used in the reference electromagnetic-signal fingerprint. Alternatively, the target electromagnetic-signal fingerprint may include a subset of the N frequencies used in the reference electromagnetic-signal fingerprint.

Next, the target electromagnetic-signal fingerprint is fed as input to the reference model created from the reference electromagnetic-signal fingerprint (operation 806), and an estimated electromagnetic-signal fingerprint is produced from the reference model (operation 808). The estimated electromagnetic-signal fingerprint may include a set of N estimated electromagnetic-signal amplitude-time series corresponding to the set of N monitored electromagnetic-signal amplitude-time series in the target electromagnetic-signal fingerprint.

The target electromagnetic-signal fingerprint is then compared to the estimated electromagnetic-signal fingerprint (operation 810), as discussed below with respect to FIG. 9. An alarm may also be generated (operation 814) based on the comparison. For example, an alarm may be generated if the comparison indicates that the target electromagnetic-signal fingerprint is deviating from the estimated electromagnetic-signal fingerprint. This deviation can be quantified by computing residuals (differences) between the target electromagnetic-signal fingerprint and the estimated electromagnetic fingerprint. These residuals can be summed and the sum can be compared to a threshold to determine whether and alarm should be generated. The threshold may be user configurable and/or based on the residuals for one or more "known good" monitored systems associated with the reference model and/or reference electromagnetic-signal fingerprint. If no alarm is generated, operations 802-810 are repeated to continue analyzing the received target electromagnetic signal. If an alarm is generated, an action to be taken is determined based on the alarm (operation 816).

Figure 9:
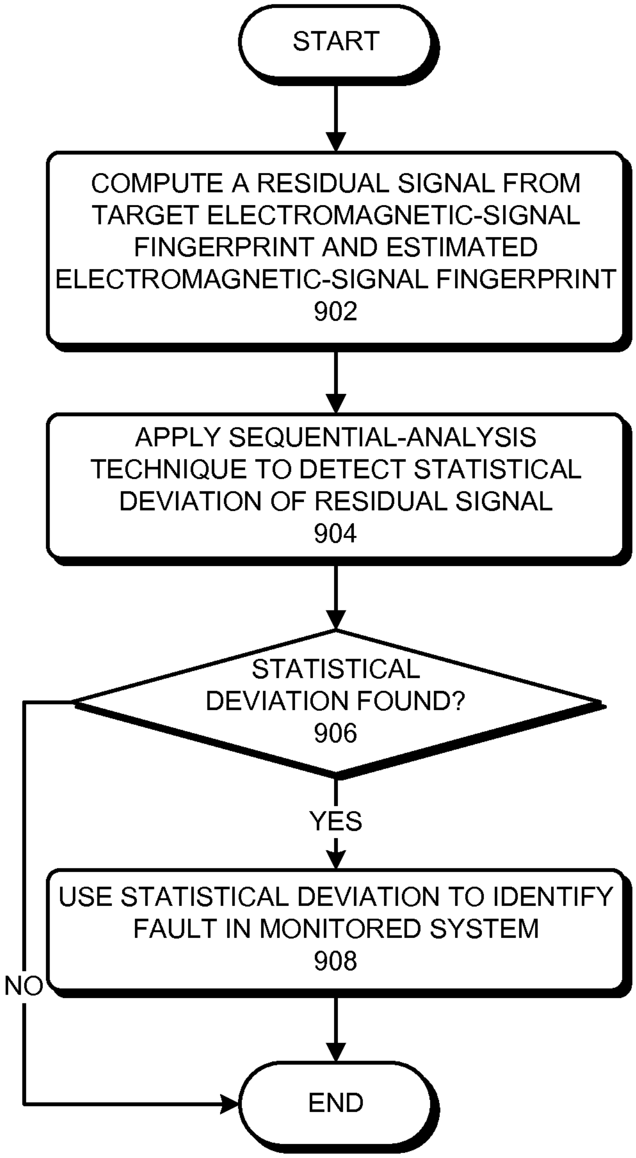
FIG. 9 shows a flowchart illustrating the process of comparing a target electromagnetic-signal fingerprint to an estimated electromagnetic-signal fingerprint in accordance with an embodiment.

FIG. 9 shows a flowchart illustrating the process of comparing a target electromagnetic-signal fingerprint to an estimated electromagnetic-signal fingerprint in accordance with an embodiment. In one or more embodiments, one or more of the steps may be omitted, repeated, and/or performed in a different order. Accordingly, the specific arrangement of steps shown in FIG. 9 should not be construed as limiting the scope of the technique.

Initially, a residual signal is computed from a target electromagnetic-signal fingerprint and a corresponding estimated electromagnetic-signal fingerprint (operation 902). The residual signal may be computed using the process described above with respect to FIG. 6. Next, a sequential-analysis technique is applied to detect a statistical deviation of the residual signal (operation 904).

In one or more embodiments, the sequential-analysis technique corresponds to a sequential probability ratio test (SPRT). The SPRT may ascertain the existence of a statistical deviation (operation 906) in the residual signal by examining the mean and variance of the residual signal. If the mean and/or variance begin to "drift" from accepted values (e.g., a null hypothesis), a statistical deviation may be found, and the statistical deviation is used to identify a fault in the monitored system (operation 908). For example, the statistical deviation may be used to identify a modified chip, a counterfeit component, and/or the presence and length of metal whiskers in the monitored system. (For example, see U.S. patent application Ser. No. 12/126,612, entitled "Determining a Total Length for Conductive Whiskers in Computer Systems," by inventors David K. McElfresh, Kenny C. Gross and Ramakrishna C. Dhanekula.) In another example, a chip which has been modified to overcome copyright protection will generate a different electronic signature, which can possibly be detected by the above-described embodiments.

The statistical deviation may also trigger an alarm, such as the alarm in operation 814 of FIG. 8. On the other hand, if the mean and variance of the residual signal are within range of the accepted values and/or in an indifference region associated with the SPRT, no statistical deviation is established and no action is currently required.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method for analyzing a target electromagnetic signal radiating from a monitored system, comprising:
- in at least one computer, performing operations for:
  - monitoring the target electromagnetic signal using a near-isotropic antenna comprising a set of receiving surfaces arranged in a regular polyhedron;
  - obtaining a set of received target electromagnetic signals from the set of receiving surfaces, wherein obtaining a set of received target electromagnetic signals comprises receiving each electromagnetic signal as the electromagnetic signal arrives from a direction in which a corresponding receiving surface of the antenna faces; and
  - assessing the integrity of the monitored system by separately analyzing each of the received target electromagnetic signals, wherein separately analyzing each of the received target electromagnetic signals comprises, for each receiving surface in the set of receiving surfaces, using a separate reference model for the receiving surface and at least one of the target electromagnetic signals received at the receiving face to produce an estimated electromagnetic signal fingerprint for the at least one of the target electromagnetic signals.

2. The method of claim 1, wherein prior to monitoring the target electromagnetic signal, the method further comprises:
- monitoring a reference electromagnetic signal radiating from the computer system using a reference near-isotropic antenna comprising a set of reference receiving surfaces arranged in the regular polyhedron;
- generating a set of reference electromagnetic-signal fingerprints from a set of received reference electromagnetic signals obtained using the reference receiving surfaces; and
- creating a set of reference models from the reference electromagnetic-signal fingerprints to characterize the monitored system.

3. The method of claim 2, wherein the reference models are created using a nonlinear, nonparametric regression technique.

4. The method of claim 3, wherein the nonlinear, nonparametric regression technique corresponds to a multivariate state estimation technique (MSET).

5. The method of claim 2, wherein separately analyzing each of the received target electromagnetic signals involves:
- generating a target electromagnetic-signal fingerprint from each of the received target electromagnetic signals;
- feeding the target electromagnetic-signal fingerprint into a reference model from the set of reference models; and
- comparing the target electromagnetic-signal fingerprint to the estimated electromagnetic-signal fingerprint.

6. The method of claim 5, wherein comparing the target electromagnetic-signal fingerprint to the estimated electromagnetic-signal fingerprint involves:
- computing a residual signal from the target electromagnetic-signal fingerprint and the estimated electromagnetic-signal fingerprint; and
- applying a sequential-analysis technique to detect a statistical deviation of the residual signal.

7. The method of claim 6, wherein the sequential-analysis technique corresponds to a sequential probability ratio test (SPRT).

8. The method of claim 6, wherein the statistical deviation is used to identify a fault in the monitored system if the assessed integrity falls below a threshold.

9. The method of claim 8, wherein the fault corresponds to at least one of a modified chip, a counterfeit component, and one or more metal whiskers.

10. The method of claim 1, wherein the set of receiving surfaces are arranged in an icosahedron.

11. The method of claim 1, wherein prior to monitoring the target electromagnetic signal, the method further comprises:
- monitoring a reference electromagnetic signal radiating from the computer system using a reference near-isotropic antenna comprising a set of reference receiving surfaces arranged in the regular polyhedron; and
- for each surface in the set of reference receiving surfaces:
  - generating a reference electromagnetic-signal fingerprint from a reference electromagnetic signal received using the surface; and
  - creating a reference model from the reference electromagnetic-signal fingerprint to characterize the monitored system.

12. A system for analyzing a target electromagnetic signal radiating from a monitored system, comprising:
- a near-isotropic antenna configured to monitor the target electromagnetic signal, comprising a set of receiving surfaces arranged in a regular polyhedron; and
- an analysis apparatus configured to:
  - obtain a set of received target electromagnetic signals from the set of receiving surfaces, wherein obtaining a set of received target electromagnetic signals comprises receiving each electromagnetic signal as the electromagnetic signal arrives from a direction in which a corresponding receiving surface of the antenna faces; and assess the integrity of the monitored system by separately analyzing each of the received target electromagnetic signals, wherein separately analyzing each of the received target electromagnetic signals comprises, where, while separately analyzing each of the received target electromagnetic signals the analysis apparatus is configured to, for each receiving surface in the set of receiving surfaces, use a separate reference model for the receiving surface and at least one of the target electromagnetic signals received at the receiving face to produce an estimated electromagnetic signal fingerprint for the at least one of the target electromagnetic signals.

13. The system of claim 12, further comprising:

a model-generation apparatus configured to:

monitor a reference electromagnetic signal radiating from the computer system using a reference near-isotropic antenna comprising a set of reference receiving surfaces arranged in the regular polyhedron;

generate a set of reference electromagnetic-signal fingerprints from a set of received reference electromagnetic signals obtained using the reference receiving surfaces; and create a set of reference models from the reference electromagnetic-signal fingerprints to characterize the monitored system.

14. The system of claim 13, wherein the reference models are created using a nonlinear, nonparametric regression technique.

15. The system of claim 14, wherein the nonlinear, nonparametric regression technique corresponds to a multivariate state estimation technique (MSET).

16. The system of claim 13, wherein separately analyzing each of the received target electromagnetic signals involves:

generating a target electromagnetic-signal fingerprint from each of the received target electromagnetic signals;

feeding the target electromagnetic-signal fingerprint into a reference model from the reference models; and comparing the target electromagnetic-signal fingerprint to the estimated electromagnetic-signal fingerprint.

17. The system of claim 16, wherein comparing the target electromagnetic-signal fingerprint to the estimated electromagnetic fingerprint involves:

computing a residual signal from the target electromagnetic-signal fingerprint and the estimated electromagnetic-signal fingerprint; and applying a sequential-analysis technique to detect a statistical deviation of the residual signal.

18. The system of claim 17, wherein the sequential-analysis technique corresponds to a sequential probability ratio test (SPRT).

19. The system of claim 17, wherein the statistical deviation is used to identify a fault in the monitored system if the assessed integrity falls below a threshold.

20. The system of claim 19, wherein the fault corresponds to at least one of a modified chip, a counterfeit component, and one or more metal whiskers.

* * * * *